United States Patent [19]

Sugahara et al.

[11] Patent Number: 5,300,822
[45] Date of Patent: Apr. 5, 1994

[54] POWER-ON-RESET CIRCUIT

[75] Inventors: Eiichi Sugahara; Takashi Fujii, both of Tokyo, Japan

[73] Assignee: NEC Corporation, Tokyo, Japan

[21] Appl. No.: 997,191

[22] Filed: Dec. 28, 1992

[30] Foreign Application Priority Data

Dec. 25, 1991 [JP] Japan .................................. 3-343409

[51] Int. Cl.⁵ .............................................. G05F 3/26
[52] U.S. Cl. .............................. 307/272.3; 307/296.8; 323/315; 330/288
[58] Field of Search ...................... 307/362, 363, 296.1, 307/296.4, 296.6, 296.7, 296.8, 296.5, 304, 272.3; 323/312, 313, 314, 315; 330/257, 288

[56] References Cited

U.S. PATENT DOCUMENTS

| | | | |
|---|---|---|---|
| 4,591,739 | 5/1986 | Nagano | 323/315 |
| 4,767,942 | 8/1988 | Minami et al. | 323/315 |
| 4,994,729 | 2/1991 | Taylor | 323/314 |
| 5,047,706 | 9/1991 | Ishibashi et al. | 323/315 |
| 5,057,792 | 10/1991 | Gay | 323/315 |

Primary Examiner—William L. Sikes
Assistant Examiner—My-Trang Ton
Attorney, Agent, or Firm—Sughrue, Mion, Zinn, Macpeak & Seas

[57] ABSTRACT

A power-on-reset circuit includes a plurality of MOS transistors and a first depletion type N-channel MOS transistor connected in series to an input terminal of a current mirror circuit. A capacitor is connected between the input terminal and a voltage supply terminal. A second depletion type N-channel MOS transistor having a low current driving capacity is connected to an output terminal of the current mirror circuit. The degree of integration can be increased by constituting an integrating circuit with depletion type N-channel MOS transistors in place of a resistor. In addition, the voltage supply voltage is compared to the sum of the threshold voltage of the plurality of MOS transistors. This makes it possible to initialize the internal circuit positively even if the rise time of the voltage supply voltage becomes larger than the time constant of the integrating circuit.

3 Claims, 2 Drawing Sheets

POWER-ON-RESET CIRCUIT

BACKGROUND OF THE INVENTION

1. Field of the Invention

The present invention relates to a power-on-reset circuit, and more specifically to a power-on-reset circuit which can particularly used in a CMOS integrated circuit.

2. Description of Related Art

As the power-on-reset circuit of the prior art, for example, the circuit having a structure disclosed in Japanese Patent Laid-open Publication No. Sho 61-296817 has been well known. The power-on-reset circuit shown in Japanese Patent Laid-open Publication No. Sho 61-296817 is so constituted that an integrating circuit constituted of a resistor and a capacitor is connected in series between a voltage supply terminal and the ground, and an inverter circuit is connected at its input to a node between the resistor and the capacitor and at its output to an output terminal.

Now, an operation of the power-on-reset circuit of the prior art will be described.

Before a voltage is applied to the voltage supply terminal, the output of the inverter circuit is at a low level.

When a voltage is applied to the voltage supply terminal in this condition, the voltage at the node between the resistor and the capacitor rises up at a speed determined by a time constant expressed by the product of the resistance value and the capacitance value of the integrating circuit constituted of the resistor and the capacitor, respectively. In addition, if the potential at the node exceeds a threshold of the inverter circuit, the inverter circuit effects a reverse operation. Thus, the potential of the output terminal brought into a high level from the moment of a powering-on, only for a period determined by a time constant of the integrating circuit, and therefore, a reset signal is outputted only for this period.

As mentioned above, the conventional power-on-reset circuit outputs the reset signal only for a period determined by a time constant of the integrating circuit constituted of a resistor and a capacitor. Therefore, if it is desired to prolong the reset signal output period, it is necessary to use a large resistor having a high resistance value and a large capacitor having a high capacitance value. Thus, a high-integration of the CMOS circuit has been difficult.

Further, a rise time of the supply voltage may be larger than a time constant of the integrating circuit. In this case, the potential at the node is always equal to the supply voltage. Therefore, the output of the inverter circuit is always at a low level, and so, a reset signal is not outputted at the output terminal.

SUMMARY OF THE INVENTION

Accordingly, it is an object of the present invention to provide a power-on-reset circuit which has overcome the above mentioned defect of the conventional one.

Another object of the present invention is to provide a power-on-reset circuit capable of increasing the integration degree of the integrated circuit and of ensuring initialization of an internal circuit.

The above and other objects of the present invention are achieved in accordance with the present invention by a power-on-reset circuit comprising a current mirror circuit connected to a first voltage supply, a first depletion type transistor which has its source connected to a second voltage supply, and which operates as a constant current source, a second depletion type transistor which has its drain connected to an output terminal of the current mirror circuit and its source connected to the second voltage supply, and which operates as a constant current source, an integrating capacitor connected at its end to an input terminal of the current mirror circuit and at its other end to the first voltage supply, and at least one MOS transistor connected at its one end to an input terminal of the current mirror circuit and at its other end to a drain of the first depletion type transistor, a voltage representative of a voltage between the first voltage supply and the second voltage supply being applied between a gate and a source of the at least one MOS transistor, an output current of the current mirror circuit being larger than a driving current of the second depletion type transistor.

In a first embodiment of the power-on-reset circuit, the at least one MOS transistor is constituted of an N-channel MOS transistor having its gate connected to the first voltage supply and its drain connected to the input terminal of the current mirror circuit, and a P-channel MOS transistor having its gate connected to the second voltage supply, its source connected to a source of the N-channel MOS transistor, and its drain connected to a drain of the first depletion type transistor.

In a second embodiment of the power-on-reset circuit, the at least one MOS transistor is constituted of a P-channel MOS transistor having its gate connected to the second voltage supply, its source connected to the input terminal of the current mirror circuit and its drain connected to connected to a drain of the first depletion type transistor.

In a third embodiment of the power-on-reset circuit, the at least one MOS transistor is constituted of an N-channel MOS transistor having its gate and its drain short-circuited to each other and connected to the input terminal of the current mirror circuit and its source connected to connected to a drain of the first depletion type transistor.

The above and other objects, features and advantages of the present invention will be apparent from the following description of preferred embodiments of the invention with reference to the accompanying drawings.

DESCRIPTION OF THE PREFERRED EMBODIMENTS

Figure 1:
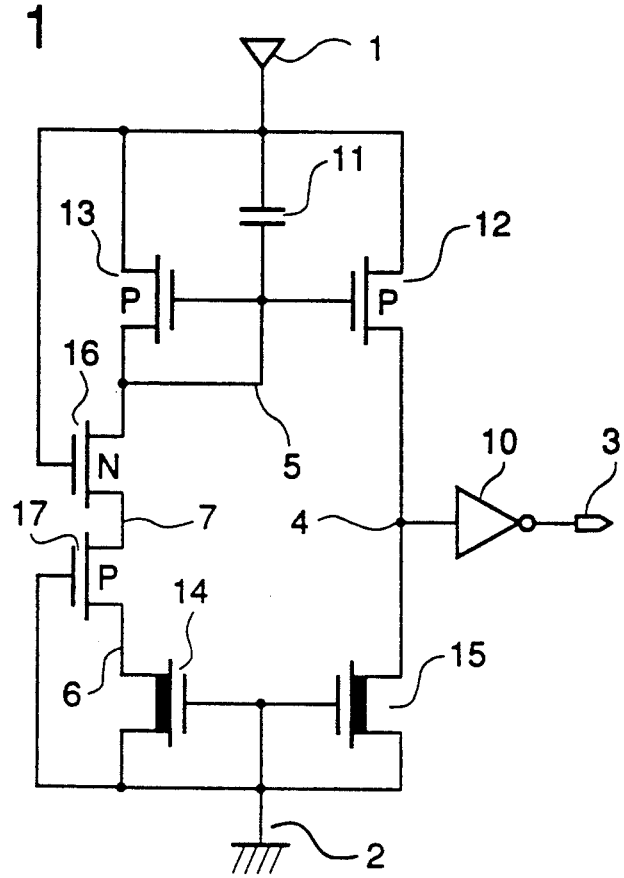
FIG. 1 is a circuit diagram illustrating a first embodiment of the power-on-reset circuit in accordance with the present invention.

Referring to FIG. 1, there is shown a circuit diagram of a first embodiment of the power-on-reset circuit in accordance with the present invention.

The shown power-on-reset circuit comprises a voltage supply terminal 1, a ground point 2, an output terminal 3 and first to fourth nodes 4, 5, 6 and 7. This power-on reset circuit comprises an inverter circuit 10, a capacitor 11, first and second P-channel MOS transistors 12 and 13, first and second depletion type N-channel MOS transistors 14 and 15, an enhancement type N-channel MOS transistor 16 and a third P-channel MOS transistor 17, which are connected as shown.

The inverter circuit 10 includes its input connected to the first node 4 and its output connected to the output terminal 3. One end of the capacitor 11 is connected to the voltage supply terminal 1 and the other end of the capacitor 11 is connected to the second node 5.

The first P-channel MOS transistor 12 has its gate connected to the second node 5, its drain connected to the first node 4 and its source connected to the voltage supply terminal 1. The second P-channel transistor 13 includes its gate and its drain connected to the second node 5 and its source connected to the voltage supply terminal 1. Thus, the first and second P-channel transistors 12 and 13 constitute a current mirror circuit. In this embodiment, the first and second P-channel transistors 12 and 13 are designed to have the current driving capacity ratio of 1 to 1. Therefore, the second node 5 constitute an input terminal of the current mirror circuit, and the first node 4 constitute an output terminal of the current mirror circuit.

The first depletion type N-channel MOS transistor 14 includes its source and its gate connected to the ground and its drain connected to the third node 6. The second depletion type N-channel MOS transistor 15 includes its source and its gate connected to the ground and its drain connected to the first node 4. In this embodiment, it is so designed that the current driving capacity of the first depletion type N-channel MOS transistor 14 is higher than that of the second depletion type N-channel MOS transistor 15.

The enhancement type N-channel MOS transistor 16 includes its source connected to the fourth node 7, its drain connected to the second node 5 and its gate connected to the source supply terminal 1. The third P-channel MOS transistor 17 includes its source connected to the fourth node 7, its drain connected to the third node 6 and its gate connected to the ground.

An operation of the power-on-reset circuit of the first embodiment will be explained.

Before a voltage is applied to the voltage supply supply 1, the output terminal is at a low level.

In this condition, it is assumed that a voltage is applied to the voltage supply terminal 1. In this case, the potential at the second node 5 rises to a voltage supply voltage through the capacitor 11 so that the first and second P-channel MOS transistor 12 and 13 are turned off, while the enhancement type N-channel MOS transistors 16 is turned on. Further, the first and second depletion type N-channel MOS transistors 14 and 15 function as a current source since the source and the gate of these transistors are grounded, respectively, so that the first and third nodes 4 and 6 are brought into a low level. Accordingly, the third P-channel MOS transistor 17 is turned on, and the potential appearing at the output terminal 3 through the inverter circuit 10 becomes at a high level.

Then, after the powering-on, an electric charge of the capacitor 11 is discharged by a current determined by the current driving capacity of the first depletion type N-channel MOS transistor 14 since the enhancement type N-channel MOS transistor 16 and the third P-channel MOS transistor 17 are on, and therefore, the potential at the second node 5 begins to lower. When this potential at the second node 5 becomes lower than a potential {(supply voltage)−(threshold voltage of P-channel MOS transistor)}, the first and second P-channel MOS transistors 12 and 13 are turned on. In addition, since the first and second P-channel MOS transistors 12 and 13 constitute the current mirror circuit having the current driving capacity ratio of 1 to 1, the current flowing through the first P-channel MOS transistor 12 is equal to a current determined by the current driving capacity of the first depletion type N-channel MOS transistor 14.

Here, since it is so designed that the first depletion type N-channel MOS transistor 14 has its current driving capacity larger than that of the second depletion type N-channel MOS transistor 15, the potential at the first node 4 changes from the low level to a high level, and the potential appearing at the output terminal 3 through the inverter circuit 10 changes from the high level to a low level. Accordingly, the output terminal 3 outputs a high level reset signal from the time of the powering-on only for a period determined by a capacitance of the capacitor 11, the current driving capacity of the first depletion type N-channel MOS transistor 14 and the threshold voltage of the P-channel MOS transistor.

Now, the operation of this circuit in the case that a rise time of the supply voltage is larger than the time constant of the integrating circuit will be explained. In this case, if the voltage supply voltage exceeds {(threshold voltage of the enhancement type N-channel MOS transistor 16)+(threshold voltage of the third P-channel MOS transistor 17)}, the first and second P-channel MOS transistors 12 and 13, the enhancement type N-channel MOS transistor 16 and the third P-channel MOS transistor 17 are turned on.

Then, since the first depletion type N-channel MOS transistor 14 is designed to have a larger current driving capability than that of the second depletion type N-channel MOS transistor 15, the first node 4 changes from the low level to a high level, and therefore, a high-level reset signal is outputted from the output terminal 3 through the inverter circuit 10 only for a period after the voltage supply is powered on until the voltage supply voltage exceeds {(threshold voltage of the enhancement type N-channel MOS transistor 16)+(threshold voltage of the third P-channel MOS transistor 17)}.

In order to prolong the output period of the reset signals, it was required in the prior art that the resistance of the resistor and the capacitance of the capacitor of the time constant circuit be increased in the power-on-reset circuit. On the contrary, in the power-on-reset circuit of the first embodiment (FIG. 1), it is required either to increase the capacitance of the capacitor 11 or to decrease the current driving capacity of the depletion type N-channel MOS transistors. The inventors prepared a layout of a power-on-reset circuit of the prior art (in Japanese Patent Laid-open Publication No. Sho 61-296817) and a power-on-reset circuit of the first embodiment (FIG. 1) and actually manufactured them on the same integrated circuit so as have their output period of the reset signal of 1 μsec. As a result, it was confirmed that the surface occupied by the power-on-reset circuit in accordance with the first embodiment of the present invention (FIG. 1) is reduced to one tenth of that of the conventional power-on-reset circuit.

Further, when the rise time of the voltage supply voltage becomes larger than the time constant of the integrating circuit, the reset signal is outputted for a period until the sum of the threshold voltage of the N-channel MOS transistor and the threshold voltage of the P-channel MOS transistor becomes equal to the voltage supply voltage, that is, until CMOS circuits of the internal circuit start their stable operation. Thus, it is possible to initialize the internal circuit positively.

Accordingly, the degree of integration can be increased by constituting an integrating circuit with the depletion type N-channel MOS transistors 14 and 15 in place of a resistor used in the conventional power-on-reset circuit. Since the voltage supply voltage is compared to the sum of the threshold voltage of the plurality of MOS transistors 16 and 17, it is possible to initialize the internal circuit positively even if the rise time of the voltage supply voltage becomes larger than the time constant of the integrating circuit.

Figure 2:
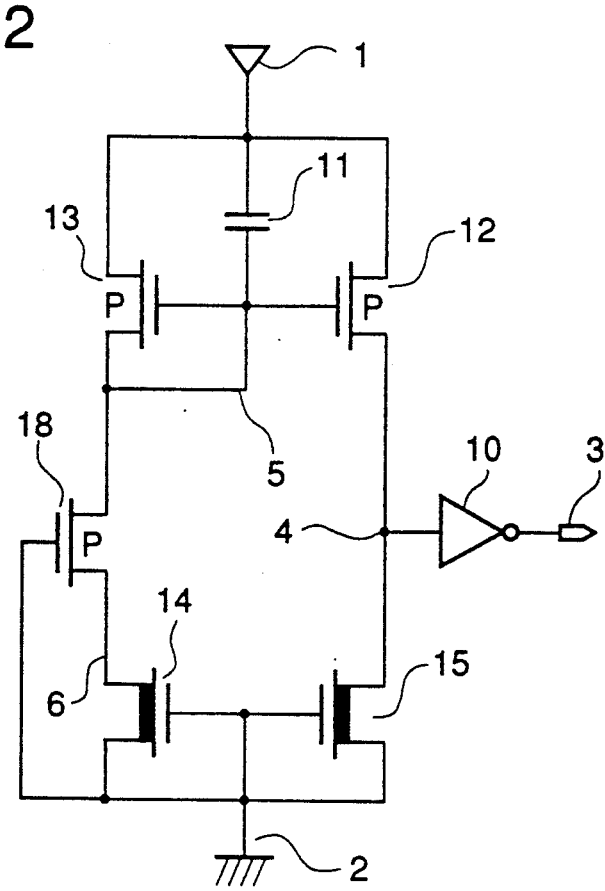
FIG. 2 is a circuit diagram illustrating a second embodiment of the power-on-reset circuit in accordance with the present invention.

Referring to FIG. 2, the power-on-reset circuit in accordance with the second embodiment of the present invention has the same structure as that of the first embodiment shown in FIG. 1, except that the enhancement N-channel MOS transistor 16 is omitted and the third P-channel MOS transistor 17 is substituted by a third P-channel MOS transistor 18. In FIG. 2, therefore, the same constituents as those shown in FIG. 1 are given the same Reference Numerals, and description thereof will be omitted.

The third P-channel MOS transistor 18 has its source connected to the second node 5, its drain connected to the third node 6 and its gate connected to the ground. Then, an operation of the power-on-reset circuit of the second embodiment will be explained.

If the rise time of the voltage supply voltage is smaller than the time constant of the integrating circuit, the power-on-reset circuit of the second embodiment effects the same operation as that of the first embodiment as mentioned above.

Next, the operation in the case that the rise time of the voltage supply voltage becomes larger than the time constant of the integrating circuit will be explained. In this case, if the voltage supply voltage exceeds {(threshold voltage of the second P-channel MOS transistor 13)+(threshold voltage of the third P-channel MOS transistor 18)}, the first to third P-channel MOS transistors 12, 13 and 18 are turned on.

Since the first depletion type N-channel MOS transistor 14 is designed to have a larger current driving capability than that of the second depletion type N-channel MOS transistor 15, the first node 4 changes from a low level to a high level, so that the potential at the output terminal 3 through the inverter circuit 10 changes from a high level to a low level. Thus, the high-level reset signal is outputted from the output terminal 3 only for a period after the voltage supply is powered on until the voltage supply voltage exceeds {(threshold voltage of the second P-channel MOS transistor 13)+(threshold voltage of the third P-channel MOS transistor 18)}.

Accordingly, the power-on-reset circuit of the second embodiment, like that of the first embodiment, makes it possible to increase the integration degree of the integrated circuit in comparison with the power-on-reset circuit of the prior art using a resistor and a capacitor. Further, if the rise time of the voltage supply voltage becomes larger than the time constant of the integrating circuit, the reset signal is outputted for a period until the voltage supply voltage becomes equal to twice of the threshold voltage of the P-channel MOS transistor, namely, until CMOS circuits of the internal circuit start their stable operation. Thus, it is possible to initialize the internal circuit positively, similarly to the first embodiment.

Figure 3:
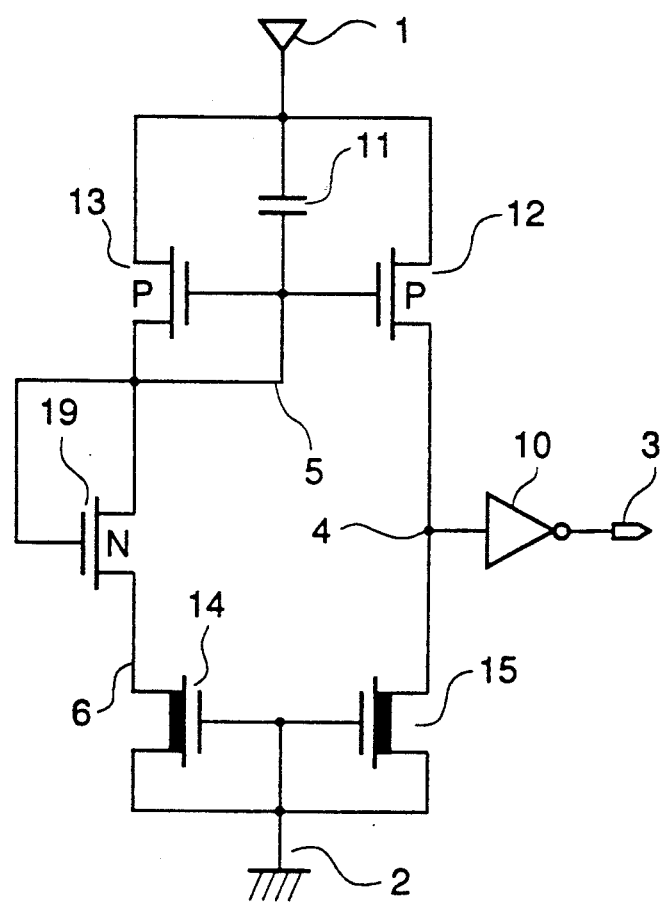
FIG. 3 is a circuit diagram illustrating a third embodiment of the power-on-reset circuit in accordance with the present invention.

Referring to FIG. 3, the power-on-reset circuit of the third embodiment of the present invention has the same structure as that of the second embodiment shown in FIG. 2, except that the third P-channel MOS transistor 18 is substituted by an N-channel MOS transistor 19. In FIG. 3, therefore, the same constituents as those shown in FIG. 2 are given the same Reference Numerals, and description thereof will be omitted.

The N-channel MOS transistor 19 has its source connected to the third node 6, and its drain and its gate connected to the second node 5.

Now, the operation of the power-on-reset circuit of the third embodiment will be explained.

When the rise time of the voltage supply voltage is smaller than the time constant of the integrating circuit, the power-on-reset circuit of the third embodiment effects the same operation as that of the first embodiment as mentioned above.

Next, the operation in the case that the rise time of the voltage supply voltage becomes larger than the time constant of the integrating circuit will be explained. In this case, the reset signal is outputted for a period until the voltage supply voltage becomes equal to {(threshold voltage of the second P-channel MOS transistor 13)+(threshold voltage of the third N-channel MOS transistor 19)}. Other operations are identical to those of the power-on-reset circuit of the second embodiment as mentioned above.

Thus, when the power-on-reset circuit of the third embodiment is used, it is obviously possible to obtain the similar effects to those of the power-on-reset circuits of the first and second embodiment.

In addition, in the embodiments of the present invention, it is possible to obtain similar effects with a circuit structure in which the polarity of the MOS transistors is reversed and in which the voltage supply terminal and the ground terminal are exchanged each other. It is also obvious that the same operation can be obtained by making the current driving capacity of the first depletion type N-channel MOS transistor 14 equal to that of the second depletion type N-channel MOS transistor 15 and by increasing the ratio of output current to input current of the current mirror circuit.

As explained above, the power-on-reset circuit in accordance the present invention has a structure in that a circuit composed of a plurality of transistors including a MOS transistor and a depletion transistor connected in series and a capacitor having its end connected to the voltage supply terminal are connected to an input terminal of the current mirror circuit and in that a depletion type transistor and an inverter circuit are connected to an output terminal of the current mirror circuit. Thus, it has an effect to make it possible to increase the integration degree of the integrated circuit. In addition, it also has an advantage of effecting the initialization of the internal circuit positively, even when the rise time of the voltage supply voltage becomes larger than the time constant of the integrating circuit.

The invention has thus been shown and described with reference to the specific embodiments. However, it should be noted that the present invention is in no way limited to the details of the illustrated structures but changes and modifications may be made within the scope of the appended claims.

We claim:

1. A power-on-reset circuit comprising:
   a current mirror circuit connected to a first voltage supply;
   a first depletion type transistor which has its source connected to a second voltage supply, and which operates as a constant current source;
   a second depletion type transistor which has its drain connected to an output terminal of said current mirror circuit and its source connected to said second voltage supply, and which operates as a constant current source;
   an integrating capacitor connected at its end to an input terminal of said current mirror circuit and at its other end to said first voltage supply;
   an N-channel MOS transistor having its gate connected to said first voltage supply and its drain connected to said input terminal of said current mirror circuit; and
   a P-channel MOS transistor having its gate connected to said second voltage supply, its source connected to a source of said N-channel MOS transistor, and its drain connected to a drain of said first depletion type transistor;
   an output current of said current mirror circuit being larger than a driving current of said second depletion type transistor.

2. A power-on-reset circuit comprising;
   a current mirror circuit connected to a first voltage supply;
   a first depletion type transistor which has its source connected to a second voltage supply, and which operates as a constant current source;
   a second depletion type transistor which has its drain connected to an output terminal of said current mirror circuit and its source connected to said second voltage supply, and which operates as a constant current source;
   an integrating capacitor connected at its end to an input terminal of said current mirror circuit and at its other end to said first voltage supply; and
   at least one MOS transistor connected at its one end to an input terminal of said current mirror circuit and at its other end to a drain of said first depletion type transistor, a voltage representative of a voltage between said first voltage supply and said second voltage supply being applied between a gate and a source of said at least one MOS transistor;
   an output current of said current mirror circuit being larger than a driving current of said second depletion type transistor;
   wherein, said at least one MOS transistor is constituted of a P-channel MOS transistor having its gate connected to said second voltage supply, its source connected to said input terminal of said current mirror circuit and its drain connected to a drain of said first depletion type transistor.

3. A power-on-reset circuit comprising;
   a current mirror circuit connected to a first voltage supply;
   a first depletion type transistor which has its source connected to a second voltage supply, and which operates as a constant current source;
   a second depletion type transistor which has its drain connected to an output terminal of said current mirror circuit and its source connected to said second voltage supply, and which operates as a constant current source;
   an integrating capacitor connected at its end to an input terminal of said current mirror circuit and at its other end to said first voltage supply; and
   at least one MOS transistor connected at its one end to an input terminal of said current mirror circuit and at its other end to a drain of said first depletion type transistor, a voltage representative of a voltage between said first voltage supply and said second voltage supply being applied between a gate and a source of said at least one MOS transistor;
   an output current of said current mirror circuit being larger than a driving current of said second depletion type transistor;
   wherein, said at least one MOS transistor is constituted of an N-channel MOS transistor having its gate and its drain short-circuited to each other and connected to said input terminal of said current mirror circuit and its source connected to a drain of said first depletion type transistor.

* * * * *